(12) United States Patent
Dogiamis et al.

(10) Patent No.: US 11,251,512 B2
(45) Date of Patent: Feb. 15, 2022

(54) PLUGGABLE MM-WAVE MODULE FOR RACK SCALE ARCHITECTURE (RSA) SERVERS AND HIGH PERFORMANCE COMPUTERS (HPCS)

(71) Applicant: Intel Corporation, Santa Clara, CA (US)

(72) Inventors: Georgios Dogiamis, Chandler, AZ (US); Sasha Oster, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 16/466,627

(22) PCT Filed: Jan. 5, 2017

(86) PCT No.: PCT/US2017/012367
§ 371 (c)(1),
(2) Date: Jun. 4, 2019

(87) PCT Pub. No.: WO2018/128617
PCT Pub. Date: Jul. 12, 2018

(65) Prior Publication Data
US 2019/0348737 A1 Nov. 14, 2019

(51) Int. Cl.
*H05K 7/00* (2006.01)
*H01P 5/08* (2006.01)
(Continued)

(52) U.S. Cl.
CPC .................. *H01P 5/08* (2013.01); *H01P 3/16* (2013.01); *H01R 12/7082* (2013.01);
(Continued)

(58) Field of Classification Search
CPC ......... H01P 5/08; H01P 3/16; H01R 12/7082; H01R 31/06; H05K 1/181; H05K 7/1485
(Continued)

(56) References Cited

U.S. PATENT DOCUMENTS

| 2010/0001808 A1* | 1/2010 | Lee ...................... H01P 5/107 333/26 |
| 2014/0270790 A1* | 9/2014 | Copper .............. H04B 10/2575 398/117 |

(Continued)

FOREIGN PATENT DOCUMENTS

| EP | 2988365 |  | 2/2016 |  |
| EP | 2988365 A1 * | 2/2016 | ................ H01P 3/16 |
| JP | 2988365 | * | 2/2016 |  |

OTHER PUBLICATIONS

International Search Report and Written Opinion for International Patent Application No. PCT/US2017/012367 dated Sep. 29, 2017, 11 pgs.

(Continued)

*Primary Examiner* — Andargie M Aychillhum
(74) *Attorney, Agent, or Firm* — Schwabe, Williamson & Wyatt P.C.

(57) ABSTRACT

Embodiments of the invention include an active mm-wave interconnect. In an embodiment, the active mm-wave interconnect includes a dielectric waveguide that is coupled to a first connector and a second connector. According to an embodiment, each of the first and second connectors may include a mm-wave engine. In an embodiment, the mm-wave engines may include a power management die, a modulator die, a demodulator die, a mm-wave transmitter die, and a mm-wave receiver die. Additional embodiments may include connectors that interface with predefined interfaces, such as small form-factor pluggables (SFP), quad small form-factor pluggables (QSFP), or octal small form- (Continued)

factor pluggables (OSFP). Accordingly, embodiments of the invention allow for plug and play functionality with existing servers and other high performance computing systems.

25 Claims, 7 Drawing Sheets

(51) Int. Cl.
*H01P 3/16* (2006.01)
*H01R 12/70* (2011.01)
*H01R 31/06* (2006.01)
*H05K 1/18* (2006.01)
*H05K 7/14* (2006.01)

(52) U.S. Cl.
CPC ............ *H01R 31/06* (2013.01); *H05K 1/181* (2013.01); *H05K 7/1485* (2013.01); *H05K 2201/10378* (2013.01)

(58) Field of Classification Search
USPC ........................................ 361/783
See application file for complete search history.

(56) References Cited

U.S. PATENT DOCUMENTS

2016/0197630 A1* 7/2016 Kawasaki ............... H04B 1/38
455/73
2016/0211566 A1 7/2016 Kikuchi et al.

OTHER PUBLICATIONS

Office Action from Chinese Patent Application No. 201780075475.9, dated Jan. 27, 2021, 9 pgs.
Office Action from Chinese Patent Application No. 201780075475.9, dated Jul. 6, 2021, 8 pgs.
International Preliminary Report on Patentability for International Patent Application No. PCT/US2017/012367 dated Jul. 18, 2019, 10 pgs.

* cited by examiner

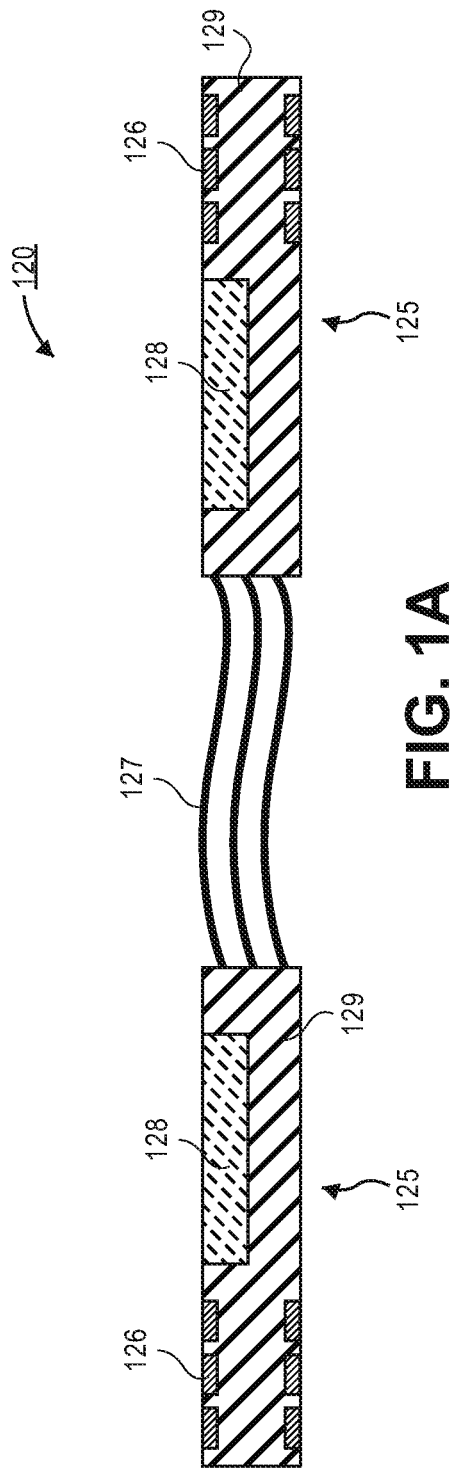
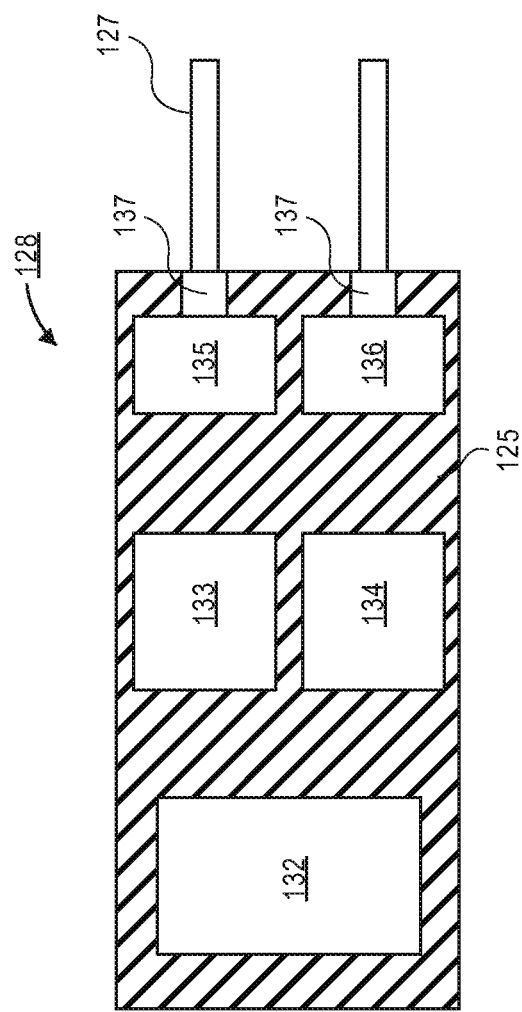
FIG. 1A
FIG. 1B

PLUGGABLE MM-WAVE MODULE FOR RACK SCALE ARCHITECTURE (RSA) SERVERS AND HIGH PERFORMANCE COMPUTERS (HPCS)

CROSS-REFERENCE TO RELATED APPLICATION

This patent application is a U.S. National Phase Application under 35 U.S.C. § 371 of International Application No. PCT/US2017/012367, filed Jan. 5, 2017, entitled "PLUGGABLE MM-WAVE MODULE FOR RACK SCALE ARCHITECTURE (RSA) SERVERS AND HIGH PERFORMANCE COMPUTERS (HPCS)," which designates the United States of America, the entire disclosure of which is hereby incorporated by reference in its entirety and for all purposes.

FIELD OF THE INVENTION

Embodiments of the invention are in the field of semiconductor packaging and, in particular, formation of pluggable active mm-wave interconnects for use in rack scale architecture (RSA) servers and high performance computers (HPCs).

BACKGROUND OF THE INVENTION

As more devices become interconnected and users consume more data, the demand on improving the performance of servers has grown rapidly. One particular area where server performance may be increased is the performance of interconnects between components, because there are many interconnects within server and high performance computing (HPC) architectures today. These interconnects include within blade interconnects, within rack interconnects, and rack-to-rack or rack-to-switch interconnects. In order to provide the desired performance, these computer systems may need to have increased data rates and switching architectures which require longer interconnects. Furthermore, due to the large number of interconnects, the cost of the interconnects and the power consumption of the interconnects should both be minimized.

In current server architectures, short interconnects (e.g., within rack interconnects and some rack-to-rack) are achieved with electrical cables, such as ethernet cables, co-axial cables, or twin-axial cables, depending on the required data rate. For longer distances (e.g., greater than five meters), optical solutions are employed due to the long reach and high bandwidth enabled by fiber optic solutions. However, as new architectures emerge, such as 100 Gigabit ethernet, traditional electrical and optical connections have significant shortfalls. Electrical connections are becoming increasingly expensive and power hungry to support the required data rates for short (e.g., 2-5 m) interconnects. For example, to extend the length of a cable or the given bandwidth on a cable, higher quality cables may need to be used or advanced equalization, modulation, and/or data correction techniques employed. Accordingly, these solutions require additional power and increase the latency of the system. For some distances and data rates required in proposed architectures, there is no viable electrical solution today. Optical transmission over fiber is capable of supporting the required data rates and distances. However, the use of optical connections results in a severe power and cost penalty, especially for short to medium distances (e.g., a few meters) because of the need for optical interconnects.

Therefore, for short to medium distance communication in the server farm, the overhead power associated with the optical fiber interconnects is too high, whereas the required error correction on traditional electrical connections creates a substantial latency (e.g., several hundred nanoseconds). This makes both technologies (traditional electrical and optical) not particularly optimal for emerging RSA servers including HPCs, where the length of many transmission lines are between 2 and 5 meters.

BRIEF DESCRIPTION OF THE DRAWINGS

FIG. 1A is a cross-sectional illustration of an active mm-wave interconnect with pluggable connectors, according to an embodiment of the invention.

FIG. 1B is a schematic illustration of the mm-wave engine, according to an embodiment of the invention.

DETAILED DESCRIPTION OF THE INVENTION

Figure 1C:
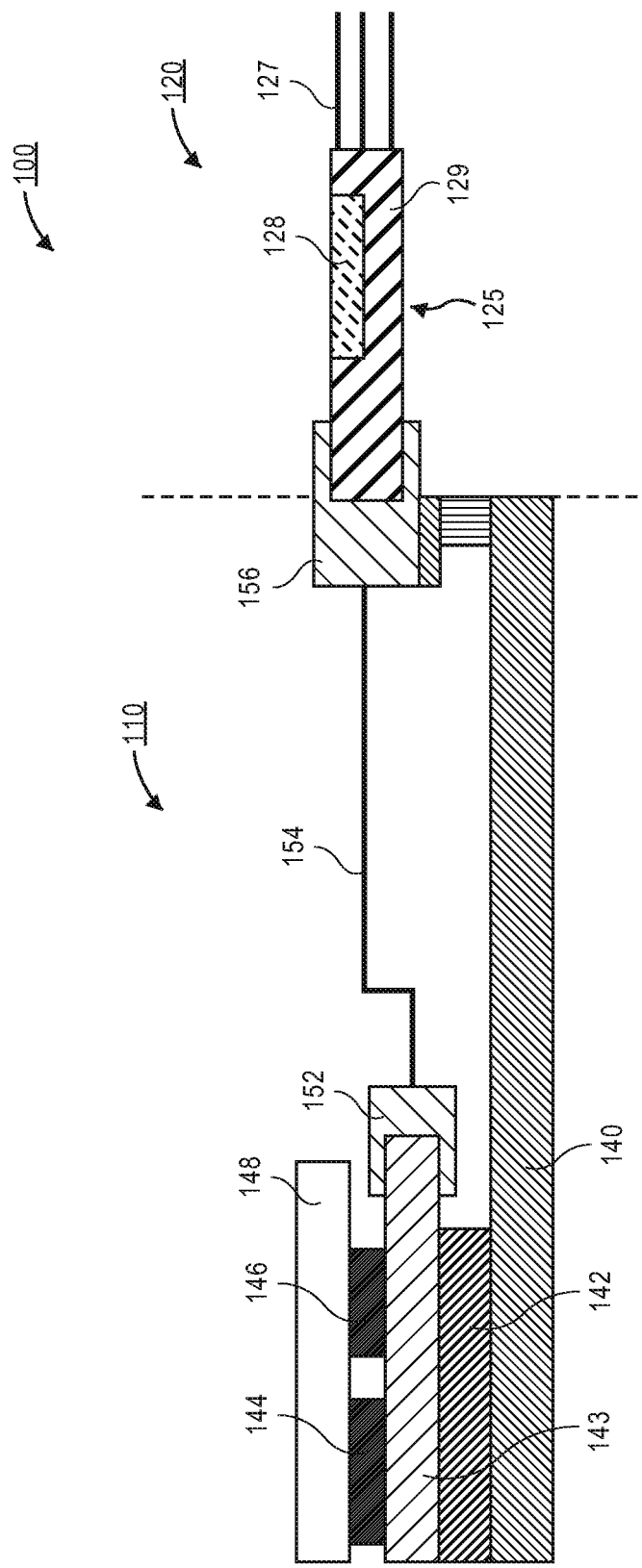
FIG. 1C is a cross-sectional illustration of an active mm-wave interconnect with pluggable connectors that is plugged into a server box, according to an embodiment of the invention.

Described herein are systems that include active mm-wave interconnects that are used in rack scale architecture (RSA) servers and high performance computers (HPCs). In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, currently available interconnect solutions (i.e., electrical cables and optical cables) do not provide adequate data rate and power consumption and latency and cost targets needed for emerging server and HPC technologies. Accordingly, embodiments of the invention include millimeter-wave waveguide (mm-wave waveguide) interconnect solutions. In an embodiment, the mm-wave waveguide comprises a dielectric waveguide bundle that is made out of low loss coated or uncoated dielectric materials and designed to operate in the mm-wave or sub-THz frequency range. The waveguides may be coupled at both ends to a package that includes a mm-wave engine. In short to medium length cables (e.g., 1-5 meters), the mm-waveguide cables provide a low power, low latency, high-speed and low cost solution. Particularly, since signals do not need to be up-converted to an optical signal, the power consumption is significantly lower than the power consumption of the alternative optical fiber interconnect technology. Additionally, in the short to medium length cables, there is no need for error correction or only need for a low level or error correction. Accordingly, the latency is lower compared to electrical cables.

While mm-wave waveguide provide improved performance, particularly in short to medium length cable, there still may be situations where other interconnect technologies are desired (e.g., the additional power consumption and cost associated with optical cables may be a preferred solution in longer interconnects, such as those greater than approximately 10 meters targeting data rates in the order of tens to hundreds of Gbps). Additionally, completely replacing existing electrical interconnects in presently available server or HPC systems may not be a cost effective solution in all situations. Accordingly, embodiments of the invention include mm-waveguide cables that utilize a pluggable architecture that can achieve a "plug and play" system with existing and future products. The use of such plug and play mm-waveguide cables provides several advantages.

One such advantage is that plug and play mm-waveguide cables may be used with existing servers or HPC systems while at the same time allowing for other interconnect technologies to be used interchangeably, depending on the needs of the system. The interchangeability between interconnect technologies is made possible by using active mm-wave interconnects. As used herein, an active mm-wave interconnect is a cable that includes a mm-wave engine that is integrated with the cable. For example, an active mm-wave engine may include circuitry and other components for converting signals to or from mm-wave signals and transmitting the mm-wave signals along the mm-waveguide, as will be described in greater detail below. Particularly, embodiments may include a mm-wave engine that is located in a connector that interfaces with predefined interfaces that are typically included in existing servers or HPC systems. For example, the connector of the active mm-wave interconnect may be a small form-factor pluggable (SFP), a quad small form-factor pluggable (QSFP), an octal small form-factor pluggable (OSFP), or the like. Since the components needed to provide mm-wave interconnects may be entirely integrated into an external cable, a user may simply plug in the active mm-wave interconnect without needing access to internal components of the system.

Embodiments that include such plug and play mm-waveguide interconnect architectures are also agnostic of the platform that is being used. Since the technology of the interconnect does not impose any packaging or system specifications on the servers or HPC systems, the cost of these systems may be reduced and it becomes easier to design servers or HPC systems. Furthermore, since the packaging of the active mm-wave interconnect is independent of the expensive CPU/server organic package, embodiments enable the use of a low-cost package for the mm-wave engine.

Additional embodiments of the invention may also include integrating the mm-wave engine into the server box while still maintaining separate packaging for the CPU and the mm-wave engine. Such embodiments may still benefit from decoupling the mm-wave engine package from the CPU/server packaging in order to provide lower overall system costs. Furthermore, in such embodiments additional components that would otherwise need to be packaged with the CPU/server package may be packaged with the mm-wave engine instead. For example, a predefined digital interconnect interface die may be integrated on the mm-wave packaging substrate. This allows for the use of different predefined digital interconnect interface dies without affecting the complex server package layout and/or design. As such, a customer has additional flexibility and control over the design of the system.

Referring now to FIG. 1A, a cross-sectional illustration of an active mm-wave interconnect 120 is shown, according to an embodiment of the invention. In an embodiment, the active mm-wave interconnect 120 includes one or more dielectric waveguides 127 suitable for transmitting mm-wave signals. The dielectric waveguides 127 may be any suitable dielectric material, such as liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), perfluoroalkoxy alkanes (PFA), combinations thereof, or the like. In an embodiment, the dielectric waveguides 127 may also include a metallic coating (not shown) to provide electrical shielding to the dielectric waveguide. In an embodiment, the dielectric waveguides may have any shape of cross section, including, but not limited to, rectangular, square, circular, oval, among others.

In the illustrated embodiment, three separate dielectric waveguides 127 are illustrated in the active mm-wave interconnect 120. However, embodiments are not limited to any specific number of dielectric waveguides. For example, there may be a single dielectric waveguide 127 or a bundle of two or more dielectric waveguides 127 in each active mm-wave interconnect 120. In an embodiment, the dielectric waveguides 127 may be short to medium length cables. For example, the length of the dielectric waveguides may be between approximately 0.5 meters and 10 meters. In an additional embodiment, the length of the dielectric waveguides may be between approximately 1 meter and 5 meters. In an additional embodiment, the length of the dielectric waveguides may be between approximately 1 meter and 10 meters.

In an embodiment, each end of the dielectric waveguides 127 may be coupled to a connector 125. According to an embodiment, the connector 125 includes a mm-wave engine 128 that is packaged on a mm-wave packaging substrate 129. In the illustrated embodiment, the connector 125 is shown without a protective enclosure in order to not obscure the Figure. However, it is to be appreciated that the connector 125 may include multiple different packaging substrates, protective enclosures, heat management solutions, and other needed components. For example, the mm-wave engine 128 may be packaged on a packaging substrate 128 and may be substantially enclosed by a protective casing. Furthermore, while the mm-wave engine 128 is illustrated as a single block, it is to be appreciated that the mm-wave engine 128 may include any number of discrete dies, interconnects, or other components that will be described in greater detail below.

In an embodiment, the connectors 125 are able to be plugged into an interface on computing system (e.g., a server, HPC, or the like). Embodiments of the invention may include connectors 125 that are pluggable into predefined interfaces. For example, typical predefined interfaces that may be used include SFP and QSFP interfaces. As illustrated, the connectors 125 may each include contacts 126 that electrically couple the mm-wave guide engine 128 to the predefined interface. While not shown, it is to be appreciated that conductive traces and vias may be formed between the contacts 126 and the mm-wave engine 128. In the illustrated embodiment, the contacts 126 are illustrated as pads. However, embodiments are not limited to such configurations. For example, the contacts 126 may be pins or any other known contact.

Referring now to FIG. 1B, a schematic diagram of the mm-wave engine 128 is shown in more detail, according to an embodiment of the invention. In an embodiment, the mm-wave engine 128 may include a power supply and management die 132. Additional embodiments may include a modulator die 133 and a demodulator die 134. In some embodiments, the modulator die 133 and the demodulator die 134 may be integrated on a single die. Embodiments may also include a mm-wave transmitter (Tx) die 135 and a mm-wave receiver (Rx) die 136. In some embodiments the Tx die 135 and the Rx die 136 may be integrated on a single die. Additional embodiments may also include any number of components being integrated on a single die. In another embodiment, the mm-wave engine 128 may be a transmitting mm-wave engine or a receiving mm-wave engine. In such embodiments, the transmitting mm-wave engine may include a Tx die 135 and a modulator die 133 and the receiving mm-wave engine may include an Rx die 136 and a demodulator die 134. The components may also be formed on any suitable semiconductor material. For example, the dies may be silicon dies, III-V material dies, silicon on insulator (SOI) dies, III-V materials integrated on a single die with silicon, or any other combination of semiconductor materials. In an embodiment, the mm-wave engine 128 may include a launcher 137 that is used to launch and assist the propagation of the mm-wave signal along the dielectric waveguide 127, a bundle of dielectric waveguides 127 (e.g., two or more dielectric waveguides separated by air, another dielectric material, or metal). In some embodiments, the launcher 137 may be integrated with a waveguide connector that mechanically and communicatively couples the dielectric waveguide 127 to the launcher 137. The launcher 137 may be any known launcher for initiating the propagation of mm-waves or receiving mm-waves, such as regular single patch launcher, a stacked-patch launcher, a microstrip-to-slot transition launcher, etc.

Referring now to FIG. 1C, a cross-sectional illustration of a server system 100 that includes an active mm-wave interconnect 120 plugged into a server 110 is shown, according to an embodiment of the invention. Since the active mm-wave interconnect 120 is agnostic to the underlying architecture of the server, embodiments of the invention may include a server 110 that includes any server architecture. For example, the server 110 may include a central processing unit (CPU) die 144 that is packaged on a packaging substrate 143. The packaging substrate 143 may be coupled to the server printed circuit board (PCB) 140 by a socket 142, LGA or BGA or any other known interconnect. In some embodiments, a predefined digital interconnect interface die 146 electrically coupled between CPU die 144 and the mm-wave engine 128 may also be packaged on the same packaging substrate 143 on which the CPU die 144 is packaged. For example, the predefined digital interconnect interface die 146 may translate and/or condition a signal so that signals may pass between the CPU die 144 and the mm-wave engine 128 even when the output of either of the CPU die 144 or the mm-wave engine 128 does not match the type of input expected by the other component. In some embodiments a heatsink 148 or any other thermal management technology may also be included in the server 110. In the illustrated embodiment, the enclosure of the server 110 is not shown in order to not obscure the Figure. However, the dashed line at the edge of the PCB 140 is used to represent the approximate location of where the outer edge of server housing may be located.

Embodiments of the invention may include a predefined interface 152 that couples the CPU packaging substrate 143 to a first end of an internal cable 154. The internal cable 154 may be any suitable electrical cable, such as a twinaxial cable, or the like. The internal cable 154 may extend to the edge of the server 110 where it is coupled to an external predefined interface 156. The external predefined interface 156 may be any suitable interface. For example, the external predefined interface 156 may be a SFP, a QSFP, or the like.

According to an embodiment of the invention, an active mm-wave interconnect 120 may be plugged into the external predefined interface 156. In the illustrated embodiment, only a first connector 125 of the active mm-wave interconnect 120 is shown for simplicity, though it is to be appreciated that the active mm-wave interconnect 120 has a connector on the second end as well, substantially similar to the active mm-wave interconnect 120 illustrated in FIG. 1A. Accordingly, the active mm-wave interconnect 120 may be external to the server 110. Therefore, the architecture of the server may not impose any packaging or design restrictions on the mm-wave engine 128. This allows for the overall cost of the active mm-wave interconnect 120 to be reduced since the packaging may not need to be as sophisticated as that of the CPU package substrate 143.

While it may be particularly beneficial to have the mm-wave engine external to the server in order to provide plug and play functionality, in some embodiments the mm-wave engine may also be integrated within the server. In such embodiments, the mm-wave engine may still be packaged on a different packaging substrate than the CPU packaging substrate. Accordingly, the architecture and layout of the CPU packaging is still not affected by the inclusion of the mm-wave guide engine.

Figure 2A:
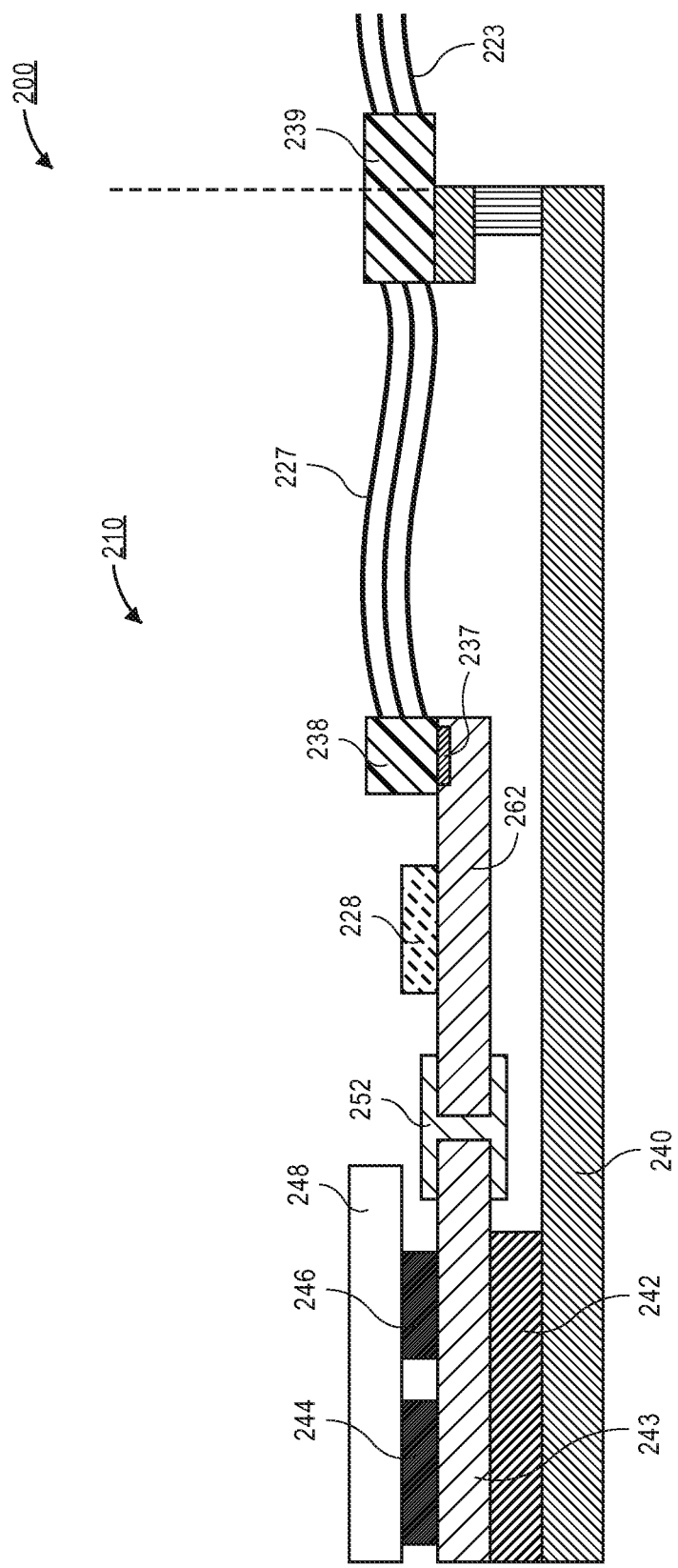
FIG. 2A is a cross-sectional illustration of a server box that includes an active mm-wave interconnect attached inside the server box and coupled to a waveguide connector at the edge of the server box, according to an embodiment of the invention.

Referring now to FIG. 2A, a cross-section illustration of a server system 200 with a mm-wave engine 228 packaged within the server 210 is shown, according to an embodiment of the invention. In an embodiment, the server 210 may be substantially similar to the server 110 described above with the exception that the mm-wave engine may be attached inside the server 210 within the footprint of the PCB 240. In an embodiment, the mm-wave packaging substrate 262 may be coupled to the CPU packaging substrate 243 by a predefined digital interface 252. As such, the mm-wave packaging substrate is independent of the CPU organic packaging substrate, and allows for the use mm-wave appropriate substrates and stack ups. This will enable better performance of the mm-wave system than direct integration with the CPU package.

In the illustrated embodiment, the launcher 237 and waveguide connector 238 are also illustrated as discrete components from the mm-wave engine 228. While illustrated as being located on a top surface of the mm-wave packaging substrate 262, it is to be appreciated that the waveguide connector 238 and the launcher 237 may be formed at any location, including the bottom surface of the mm-wave packaging substrate 262 or embedded within the mm-wave packaging substrate 262. In an additional embodiment, the waveguide connector 238 and/or the launcher may be overmolded.

In an embodiment, the dielectric waveguide 227 may be coupled to the waveguide connector 238 and run substantially to the edge of the PCB 240. In some embodiments, the dielectric waveguide 227 may be connected to a passive pluggable connector 239. The passive pluggable connector 239 may couple the dielectric waveguides 227 that are inside the server 210 to dielectric waveguides 223 that are external to the server 210. In such embodiments, the external dielectric waveguides 223 may be referred to as passive dielectric waveguides 223 since they do not require a dedicated mm-wave engine since the conversion to mm-wave signals occurs within the server. Accordingly, the external dielectric waveguides 223 may be even less expensive to manufacture since they do not require the additional circuitry needed for the mm-wave conversion.

Figure 2B:
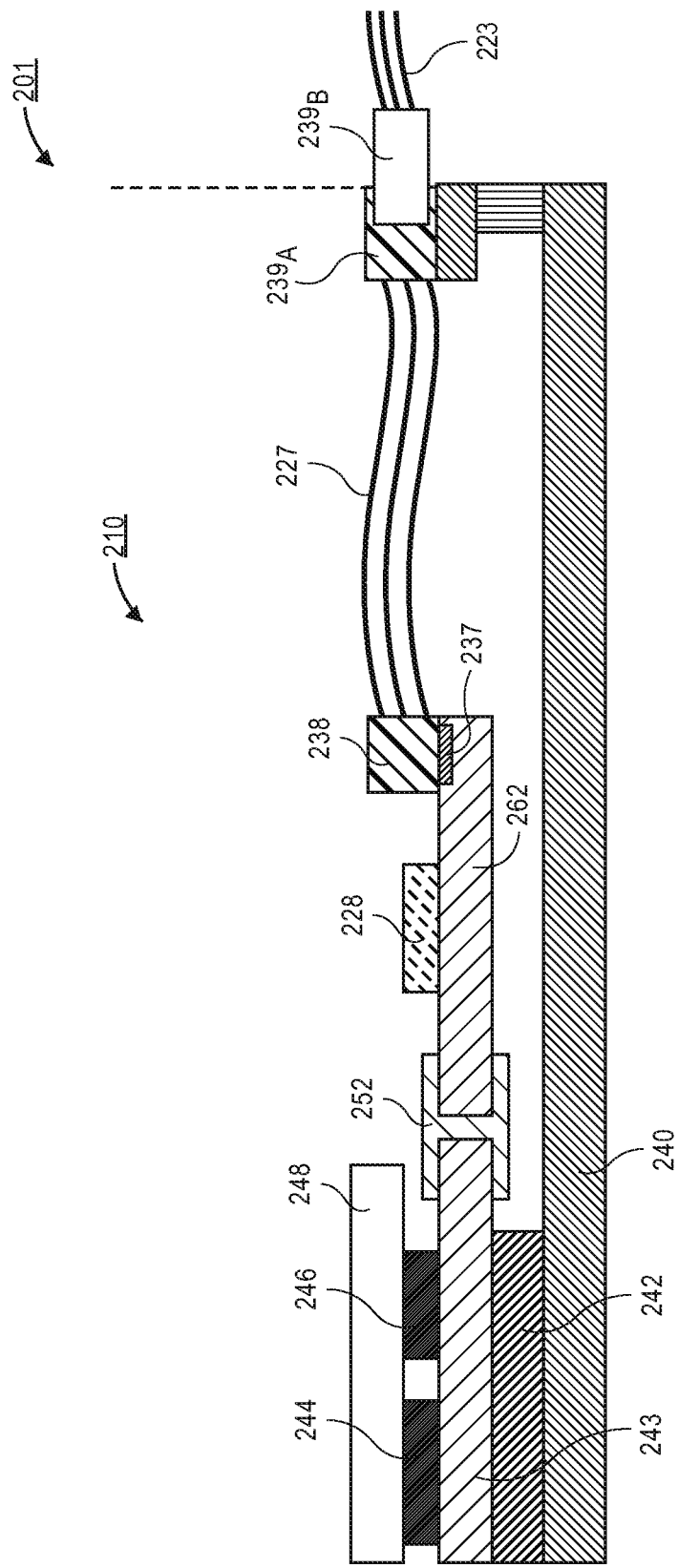
FIG. 2B is a cross-sectional illustration of a server box that includes an active mm-wave interconnect attached inside the server box and coupled to a detachable waveguide connector at the edge of the server box, according to an embodiment of the invention.

Referring now to FIG. 2B, a cross-sectional illustration of an embodiment of the invention that is substantially similar to the embodiment illustrated in FIG. 2A is shown, with the exception that the passive pluggable connector is shown as a male-female plug. In such embodiments, the female portion 239A of the repeater may be a positioned at the edge of the server 210 and the male portion $239_B$ may be inserted from outside the server 210. Accordingly, the passive dielectric waveguides 223 may be replaced by switching out an external cable only, without needing to alter anything within the server box. This may allow for simple changes to the system 201 (e.g., to change the length of the cable or replace a damaged cable).

Figure 2C:
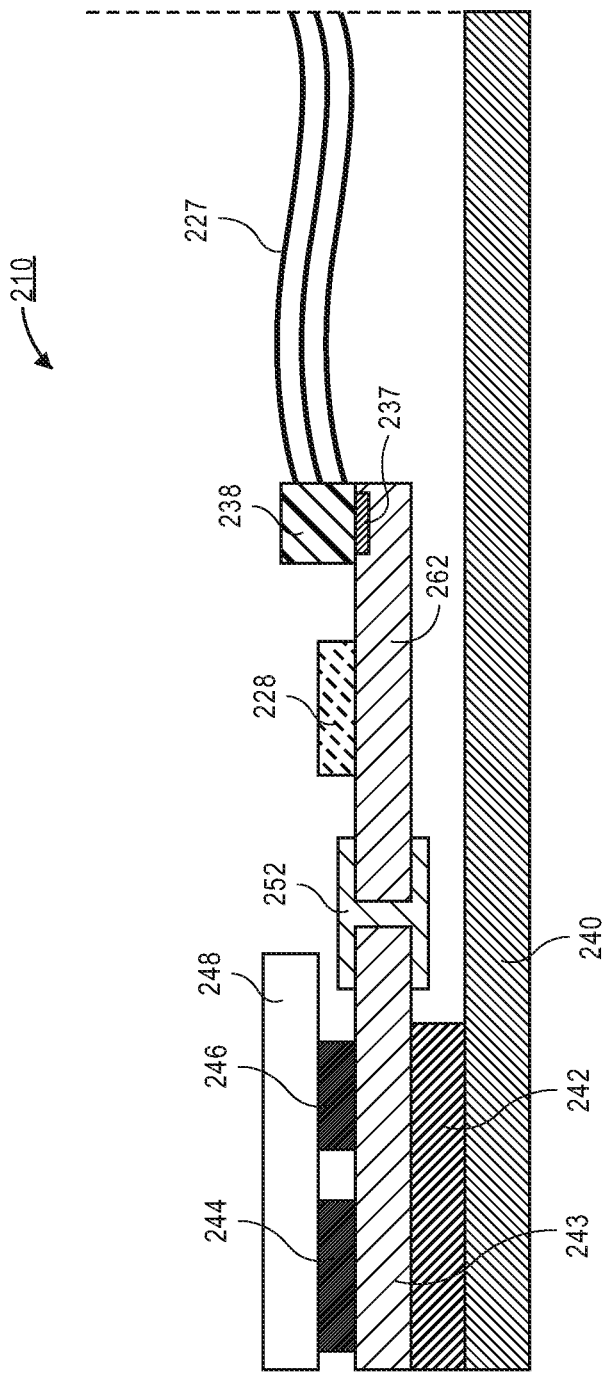
FIG. 2C is a cross-sectional illustration of a server box that includes an active mm-wave interconnect attached inside the server box and extending out of the server box without a waveguide connector, according to an embodiment of the invention.

Referring now to FIG. 2C, a cross-sectional illustration of an embodiment of the invention that is substantially similar to the embodiment illustrated in FIG. 2A is shown, with the exception that dielectric waveguides 227 may leave the server box without any waveguide connector at the edge of the box. Such embodiments are made possible since the active mm-wave cable is able to provide high bandwidth, low latency, and low power consumption at short to medium lengths (e.g., 1 meter to 10 meters). Accordingly, the dielectric waveguides 227 may extend out from the box and still have sufficient length to make interconnects with other systems. In such an embodiment, the second end of the dielectric waveguides 227 that are not shown may have a connector similar to connectors 125 described above. As such, the active mm-wave interconnect may allow for plug and play functionality. Alternative embodiments may also include a second end of the mm-wave interconnect that is coupled to a mm-wave engine within a second server, similar to the first end illustrated in FIG. 2C. By removing the need for a waveguide connector, embodiments may allow for improved performance since additional alignment errors, signal reflections, and insertion losses may be avoided since fewer connections/transitions are needed.

Figure 3A:
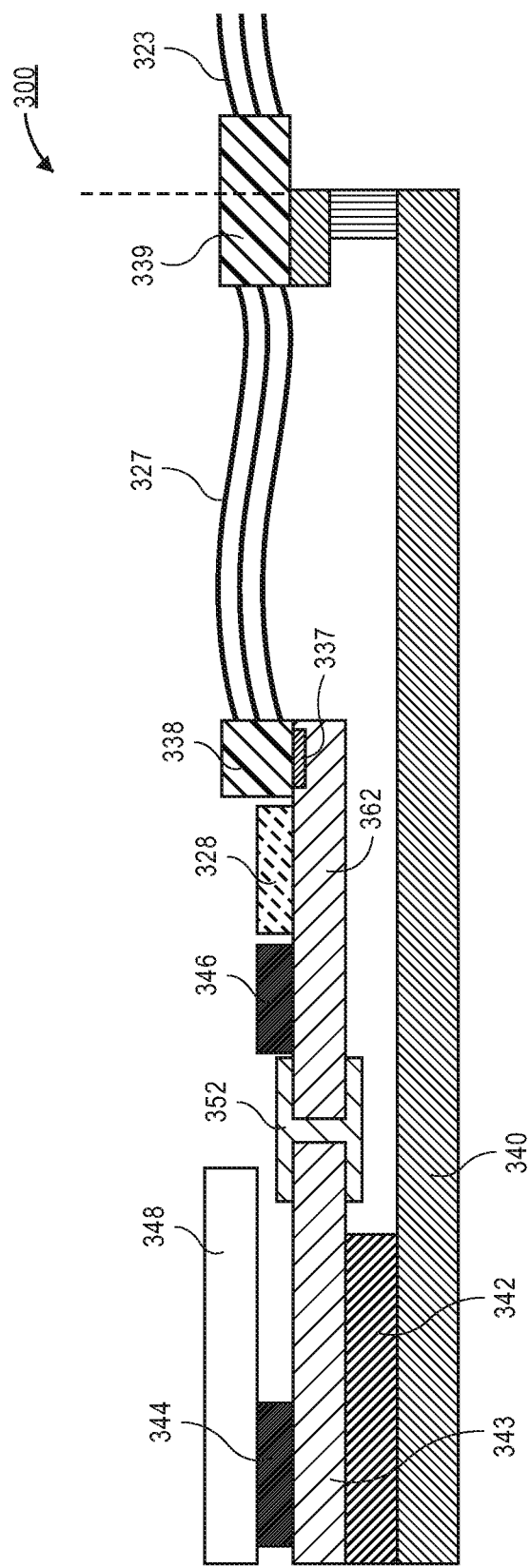
FIG. 3A is a cross-sectional illustration of a server box that includes an active mm-wave interconnect attached inside the server box where the predefined digital interconnect interface is mounted on the package of the active mm-wave interconnect, according to an embodiment of the invention.

According to an additional embodiment of the invention, a predefined digital interconnect interface die may also be integrated on the same substrate as the mm-wave engine. An example of such an embodiment is illustrated with respect to FIG. 3A. FIG. 3A is substantially similar to FIG. 2A, with the exception that the predefined digital interconnect interface die 346 is removed from the CPU packaging substrate 343 and is located on the mm-wave engine packaging substrate 362. Such embodiments allow for greater flexibility in the choice of which predefined digital interconnect interface die 346 is chosen for the system. For example, a predefined digital interconnect interface die obtained from any manufacturer may be used without affecting the complex server package layout and/or design. Additionally, removing the predefined digital interconnect interface die 346 from the CPU packaging substrate 343 may provide additional space on the CPU packaging substrate 343 to allow for increased memory or the like to be added to the server 310.

When moving the predefined digital interconnect interface die 346 to the mm-wave engine packaging substrate 362, the predefined interconnect 352 between the mm-wave engine packaging substrate 362 and the CPU packaging substrate 343 may need to be modified. For example, when the predefined digital interconnect interface 346 is a serializer/deserializer (SERDES) die, the predefined digital interconnect interface die 346 receives input signals from a plurality of pins (e.g., ten or more) from the CPU and serializes these inputs for transmission along a single output pin. Accordingly, when the predefined digital interconnect interface die 346 is moved to the mm-wave engine packaging substrate 362, it may be necessary to increase the number of conductive traces that pass through the predefined interconnect 352.

Figure 3B:
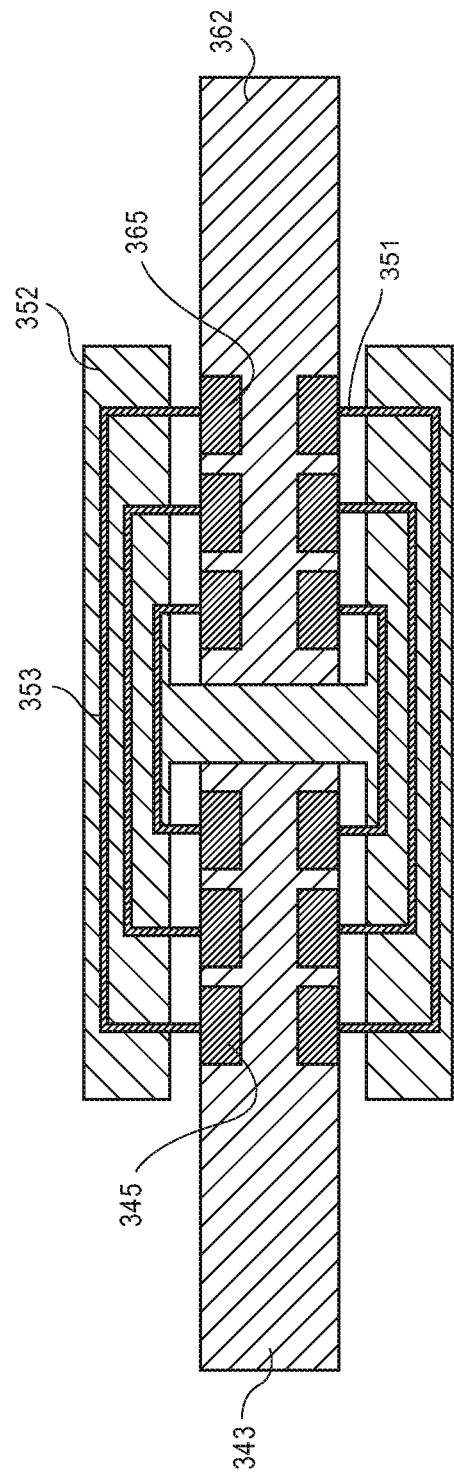
FIG. 3B is a cross-sectional illustration of the connector that connects the CPU package substrate to the active mm-wave package substrate, according to an embodiment of the invention.

Referring now to FIG. 3B, an enlarged cross-sectional illustration of the predefined interconnect 352 is shown according to an embodiment of the invention. As illustrated, the plurality of signal lines may be accommodated by providing contact pads 345, 365 along the top surface and the bottom surfaces of both the CPU packaging substrate 343 and the mm-wave engine packaging substrate 362. Additional embodiments may also include contacts along the edge surface of the packaging substrates. The predefined interconnect 352 may therefore, include a plurality of traces 353 and corresponding pins 351 to provide electrical connections between corresponding contact pads 345, 365. As such, embodiments are able to provide the pin density needed to pass signals from the CPU die 344 to the predefined digital interconnect interface die 346 over the predefined interconnect 352.

Figure 4:
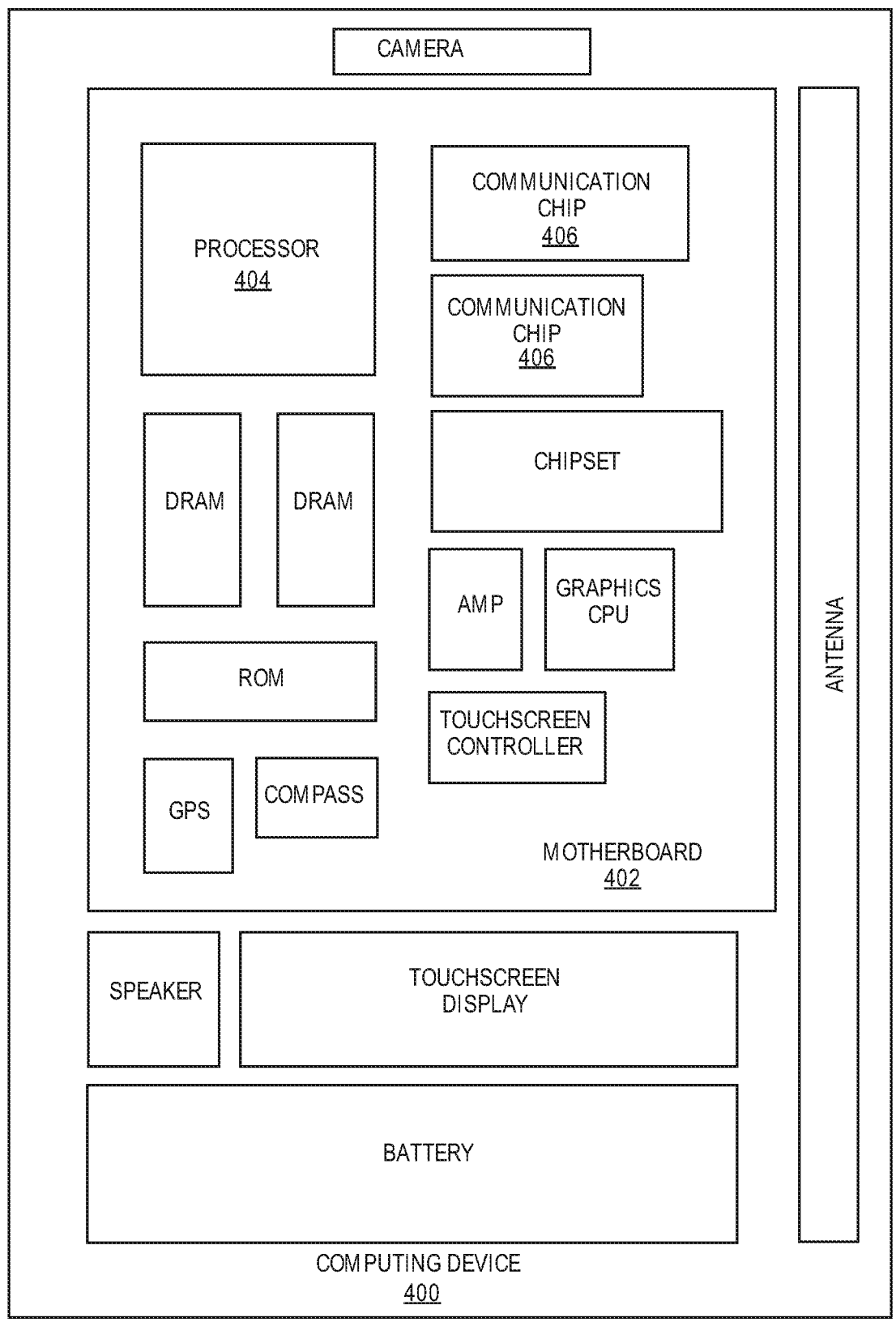
FIG. 4 is a schematic of a computing device built in accordance with an embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be packaged on an organic substrate and provide signals that are converted to a mm-wave signal and propagated along an active mm-wave interconnect, in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be packaged on an organic substrate and provide signals that are converted to a mm-wave signal and propagated along an active mm-wave interconnect, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an active mm-wave interconnect comprising: a dielectric waveguide; a first connector coupled to a first end of the dielectric waveguide, wherein the first connector comprises a first mm-wave engine; and a second connector coupled to a second end of the dielectric waveguide, wherein the second connector comprises a second mm-wave engine.

Example 2: the active mm-wave interconnect of Example 1, wherein the first and second mm-wave engines each comprise: a power management die; a modulator die and/or a demodulator die; and a mm-wave transmitter die and/or a mm-wave receiver die.

Example 3: the active mm-wave interconnect of Example 1 or Example 2, wherein the first mm-wave engine is packaged on a first mm-wave packaging substrate, and the second mm-wave engines is packaged on a second mm-wave packaging substrate.

Example 4: the active mm-wave interconnect of Example 2 or Example 3, wherein two or more of the components of the mm-wave engine are fabricated on a single die.

Example 5: the active mm-wave interconnect of Example 1, Example 2, Example, 3, or Example 4, wherein the dielectric waveguide is coupled to the first connector by a first waveguide connector attached to the first dielectric waveguide package, and the dielectric waveguide is coupled to the second connector by a second waveguide connector attached to the second mm-waveguide package.

Example 6: the active mm-wave interconnect of Example 1, Example 2, Example, 3, Example 4, or Example 5, wherein the first connector and the second connector are predefined interface connectors.

Example 7: the active mm-wave interconnect of Example 6, wherein the predefined interface connectors are small form-factor pluggables (SFP), quad small form-factor pluggables (QSFP), or octal small form-factor pluggables (OSFP).

Example 8: the active mm-wave interconnect of Example 1, Example 2, Example, 3, Example 4, Example 5, Example 6, or Example 7, wherein the dielectric waveguide is between 1 meter and 10 meters in length.

Example 9: the active mm-wave interconnect of Example 1, Example 2, Example, 3, Example 4, Example 5, Example 6, Example 7, or Example 8, wherein the dielectric wave guide is covered with a metallic layer.

Example 10: the active mm-wave interconnect of Example 1, Example 2, Example, 3, Example 4, Example 5, Example 6, Example 7, Example 8, or Example 9, wherein the dielectric wave guide is formed from one or more of liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

Example 11: a computing system, comprising: a printed circuit board (PCB); a central processing unit (CPU) die packaged on a CPU packaging substrate, wherein the CPU packaging substrate is electrically coupled to the PCB; and a mm-wave engine packaged on a mm-wave engine packaging substrate, wherein the mm-wave engine packaging substrate is coupled to the CPU packaging substrate with a predefined interface.

Example 12: the computing system of Example 11, further comprising: a mm-wave launcher coupled to the mm-wave engine; a waveguide connector coupled to the mm-wave launcher; and a dielectric waveguide, wherein a first end of the dielectric waveguide is coupled to the waveguide connector.

Example 13: the computing system of Example 11 or Example 12, wherein a second the dielectric waveguide is coupled to a waveguide connector at an edge of the PCB.

Example 14: the computing system of Example 13, wherein the waveguide connector is coupled to a second dielectric waveguide that extends past an edge of the PCB.

Example 15: the computing system of Example 14, wherein the waveguide connector comprises a female connector portion, and wherein the second dielectric waveguide is coupled to a male connector portion that is coupled with the female connector portion.

Example 16: the computing system of Example 11, Example 12, Example 13, Example 14, or Example 15, further comprising: a predefined digital interconnect interface die electrically coupled between the CPU die and the mm-wave engine.

Example 17: the computing system of Example 16, wherein the predefined digital interconnect interface die is packaged on the CPU packaging substrate.

Example 18: the computing system of Example 17, wherein the predefined digital interconnect interface die is packaged on the mm-wave packaging substrate.

Example 19: the computing system of Example. 16, Example 17, or Example 18, wherein the predefined interface includes a plurality of pins that contact electrical pads on more than one surface of the CPU package substrate and the mm-wave packaging substrate.

Example 20: the computing system of Example 11, Example 12, Example 13, Example 14, Example 15, Example 16, Example 17, Example 18, or Example 19, wherein the dielectric waveguide is covered with a metallic layer.

Example 21: the computing system of Example 11, Example 12, Example 13, Example 14, Example 15, Example 16, Example 17, Example 18, Example 19, or Example 20 wherein the dielectric waveguide is formed from one or more of polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

Example 22: the computing system of Example 11, Example 12, Example 13, Example 14, Example 15, Example 16, Example 17, Example 18, Example 19, Example 20, or Example 21, wherein the mm-wave engine comprises: a power management die; a modulator die and/or a demodulator die; and a mm-wave transmitter die and/or a mm-wave receiver die Example 23: the computing system of Example 11, Example 12, Example 13, Example 14, Example 15, Example 16, Example 17, Example 18, Example 19, Example 20, Example 21, or Example 22, wherein the computing system is a server or a high performance computing (HPC) system.

Example 24: a computing system, comprising: a printed circuit board (PCB); a central processing unit (CPU) die packaged on a CPU packaging substrate, wherein the CPU packaging substrate is electrically coupled to the PCB; a predefined interface coupling a first end of an electrical cable to the CPU packaging substrate; an external predefined interface coupled to a second end of the electrical cable proximate to an edge of the system PCB; and an active mm-wave interconnect coupled to the external predefined interface, wherein the active mm-wave interconnect comprises: a dielectric waveguide, wherein the dielectric waveguide is coated with a metallic layer; a first connector coupled to a first end of the dielectric waveguide, wherein the first connector comprises a first mm-wave engine; and a second connector coupled to a second end of the dielectric waveguide, wherein the second connector comprises a second mm-wave engine, and wherein the first connector and the second connector are small form-factor pluggables (SFP) or quad small form-factor pluggables (QSFP), or octal small form-factor pluggables (OSFP).

Example 25: the computing system of Example 24, wherein the dielectric waveguide has a length between approximately 1 meter and 10 meters.

What is claimed is:

1. An active millimeter-wave (mm-wave) interconnect comprising:
   a dielectric waveguide;
   a first connector coupled to a first end of the dielectric waveguide, wherein the first connector comprises a first mm-wave engine, and wherein the first mm-wave engine converts an electrical domain to a mm-wave domain and/or converts a mm-wave domain to an electrical domain, the first connector permanently attached to the first end of the dielectric waveguide, and the first connector comprising a first plurality of electrical contacts for providing or receiving the electrical domain; and
   a second connector coupled to a second end of the dielectric waveguide, wherein the second connector comprises a second mm-wave engine, and wherein the second mm-wave engine converts an electrical domain to a mm-wave domain and/or converts a mm-wave domain to an electrical domain, the second connector permanently attached to the second end of the dielectric waveguide, and the second connector comprising a second plurality of electrical contacts for providing or receiving the electrical domain.

2. The active mm-wave interconnect of claim 1, wherein the first and second mm-wave engines each comprise:
   a power management die;
   a modulator die and/or a demodulator die; and
   a mm-wave transmitter die and/or a mm-wave receiver die.

3. The active mm-wave interconnect of claim 2, wherein the first mm-wave engine is packaged on a first mm-wave packaging substrate, and the second mm-wave engine is packaged on a second mm-wave packaging substrate.

4. The active mm-wave interconnect of claim 3, wherein two or more of the components of the mm-wave engine are fabricated on a single die.

5. The active mm-wave interconnect of claim 2, wherein the dielectric waveguide is coupled to the first connector by a first waveguide connector attached to the first dielectric waveguide package, and the dielectric waveguide is coupled to the second connector by a second waveguide connector attached to the second mm-waveguide package.

6. The active mm-wave interconnect of claim 1, wherein the first connector and the second connector are predefined interface connectors.

7. The active mm-wave interconnect of claim 6, wherein the predefined interface connectors are small form-factor pluggables (SFP), quad small form-factor pluggables (QSFP), or octal small form-factor pluggables (OSFP).

8. The active mm-wave interconnect of claim 1, wherein the dielectric waveguide is between 1 meter and 10 meters in length.

9. The active mm-wave interconnect of claim 1, wherein the dielectric wave guide is covered with a metallic layer.

10. The active mm-wave interconnect of claim 1, wherein the dielectric wave guide is formed from one or more of liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

11. A computing system, comprising:
   a printed circuit board (PCB);
   a central processing unit (CPU) die packaged on a CPU packaging substrate, wherein the CPU packaging substrate is electrically coupled to the PCB; and
   a waveguide connector comprising a millimeter-wave (mm-wave) engine packaged on a mm-wave engine packaging substrate, wherein the mm-wave engine packaging substrate is coupled to the CPU packaging substrate with a predefined interface, and wherein the mm-wave engine converts an electrical domain to a mm-wave domain and/or converts a mm-wave domain to an electrical domain, the waveguide connector permanently attached to an end of a dielectric waveguide, and the waveguide connector comprising a plurality of electrical contacts for providing or receiving the electrical domain.

12. The computing system of claim 11, further comprising:
   a mm-wave launcher coupled to the mm-wave engine.

13. The computing system of claim 12, wherein a second the dielectric waveguide is coupled to the waveguide connector at an edge of the PCB.

14. The computing system of claim 13, wherein the waveguide connector is coupled to the second dielectric waveguide that extends past an edge of the PCB.

15. The computing system of claim 14, wherein the waveguide connector comprises a female connector portion, and wherein the second dielectric waveguide is coupled to a male connector portion that is coupled with the female connector portion.

16. The computing system of claim 12, further comprising:
   a predefined digital interconnect interface die electrically coupled between the CPU die and the mm-wave engine.

17. The computing system of claim 16, wherein the predefined digital interconnect interface die is packaged on the CPU packaging substrate.

18. The computing system of claim 17, wherein the predefined digital interconnect interface die is packaged on the mm-wave packaging substrate.

19. The computing system of claim 18, wherein the predefined interface includes a plurality of pins that contact electrical pads on more than one surface of the CPU package substrate and the mm-wave packaging substrate.

20. The computing system of claim 12, wherein the dielectric waveguide is covered with a metallic layer.

21. The computing system of claim 12, wherein the dielectric waveguide is formed from one or more of polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

22. The computing system of claim 12, wherein the mm-wave engine comprises:
   a power management die;
   a modulator die and/or a demodulator die; and
   a mm-wave transmitter die and/or a mm-wave receiver die.

23. The computing system of claim 11, wherein the computing system is a server or a high performance computing (HPC) system.

24. A computing system, comprising:
   a printed circuit board (PCB);
   a central processing unit (CPU) die packaged on a CPU packaging substrate, wherein the CPU packaging substrate is electrically coupled to the PCB;
   a predefined interface coupling a first end of an electrical cable to the CPU packaging substrate;
   an external predefined interface coupled to a second end of the electrical cable proximate to an edge of the system PCB; and
   an active millimeter-wave (mm-wave) interconnect coupled to the external predefined interface, wherein the active mm-wave interconnect comprises:
      a dielectric waveguide, wherein the dielectric waveguide is coated with a metallic layer;
      a first connector coupled to a first end of the dielectric waveguide, wherein the first connector comprises a first mm-wave engine, and wherein the first mm-wave engine converts an electrical domain to a mm-wave domain and/or converts a mm-wave domain to an electrical domain, the first connector permanently attached to the first end of the dielectric waveguide, and the first connector comprising a first plurality of electrical contacts for providing or receiving the electrical domain; and
      a second connector coupled to a second end of the dielectric waveguide, wherein the second connector comprises a second mm-wave engine, wherein the second mm-wave engine converts an electrical domain to a mm-wave domain and/or converts a mm-wave domain to an electrical domain, the second connector permanently attached to the second end of the dielectric waveguide, and the second connector comprising a second plurality of electrical contacts for providing or receiving the electrical domain, and wherein the first connector and the second connector are small form-factor pluggables (SFP) or quad small form-factor pluggables (QSFP), or octal small form-factor pluggables (OSFP).

25. The computing system of claim 24, wherein the dielectric waveguide has a length between approximately 1 meter and 10 meters.

* * * * *